(12) United States Patent
Pao et al.

(10) Patent No.: US 10,840,106 B2
(45) Date of Patent: Nov. 17, 2020

(54) PLANARIZATION AND FLIP-CHIP FABRICATION PROCESS OF FINE-LINE-GEOMETRY FEATURES WITH HIGH-ROUGHNESS METAL-ALLOYED SURFACES

(71) Applicant: OEpic SEMICONDUCTORS, INC., Sunnyvale, CA (US)

(72) Inventors: Yi-Ching Pao, Sunnyvale, CA (US); James Pao, Sunnyvale, CA (US); Majid Riaziat, Sunnyvale, CA (US); Ta-Chung Wu, Sunnyvale, CA (US)

(73) Assignee: OEPIC SEMICONDUCTORS, INC., Sunnyvale, CA (US)

( * ) Notice: Subject to any disclaimer, the term of this patent is extended or adjusted under 35 U.S.C. 154(b) by 0 days.

(21) Appl. No.: 16/594,895

(22) Filed: Oct. 7, 2019

(65) Prior Publication Data

US 2020/0118832 A1 Apr. 16, 2020

Related U.S. Application Data

(60) Provisional application No. 62/744,433, filed on Oct. 11, 2018.

(51) Int. Cl.
| | | |
|---|---|---|
| *H01L 21/321* | (2006.01) | |
| *H01L 21/02* | (2006.01) | |
| *H01L 21/4763* | (2006.01) | |
| *H01L 21/463* | (2006.01) | |
| *H01L 21/60* | (2006.01) | |

(52) U.S. Cl.
CPC .... *H01L 21/3212* (2013.01); *H01L 21/02642* (2013.01); *H01L 21/463* (2013.01); *H01L 21/4763* (2013.01); *H01L 2021/6024* (2013.01); *H01L 2021/60045* (2013.01)

(58) Field of Classification Search
CPC ... H01L 2021/60045; H01L 2021/6024; H01L 21/02642; H01L 21/3212; H01L 21/463; H01L 21/4763; H01L 29/66; H01L 21/0337; H01L 21/28575
USPC ....... 438/692, 693, 694, 736, 740, 745, 669, 438/671
See application file for complete search history.

(56) References Cited

U.S. PATENT DOCUMENTS

| | | | |
|---|---|---|---|
| 2013/0249096 A1* | 9/2013 | Eissa | H01L 21/76898 257/751 |
| 2014/0363973 A1* | 12/2014 | Kanamaru | C09K 3/1463 438/693 |
| 2015/0011066 A1* | 1/2015 | Mizokuchi | H01L 29/4236 438/270 |
| 2017/0110424 A1* | 4/2017 | Liu | H01L 24/05 |

* cited by examiner

*Primary Examiner* — Lan Vinh
(74) *Attorney, Agent, or Firm* — Weiss & Moy, P.C.; Jeffrey D. Moy

(57) ABSTRACT

A method of semiconductor device fabrication that enables fine-line geometry lithographic definition and small form-factor packaging comprises: forming contacts on a metal layer of the semiconductor device; applying a protective mask layer over active regions and surfaces of the contacts having rough surface morphology; planarizing a surface of the semiconductor device until the protective mask layer is removed and the surfaces of the contacts having rough surface morphology are planarized; and forming contact stacks on the surfaces of the contacts which are planarized.

20 Claims, 3 Drawing Sheets

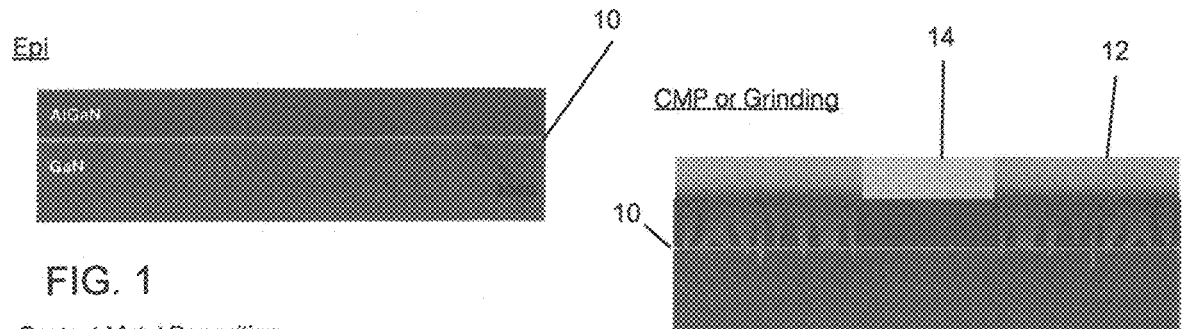
FIG. 1
FIG. 5
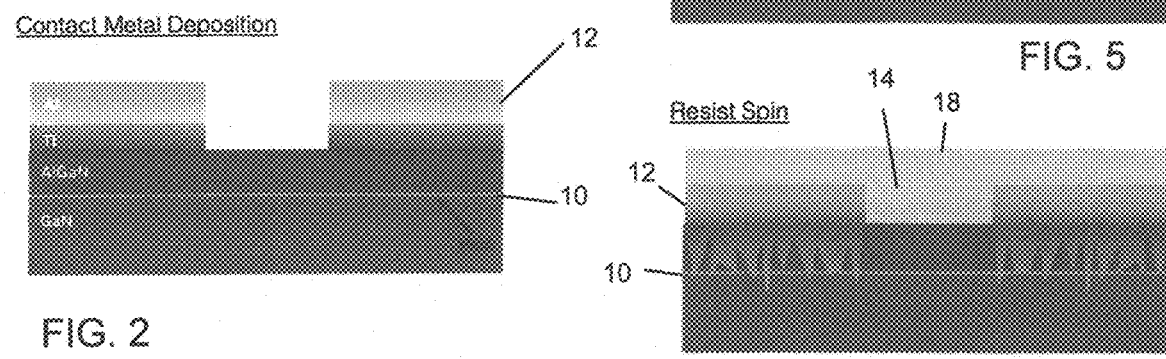
FIG. 2
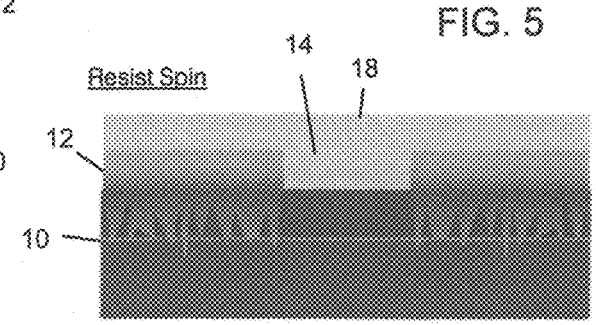
FIG. 6
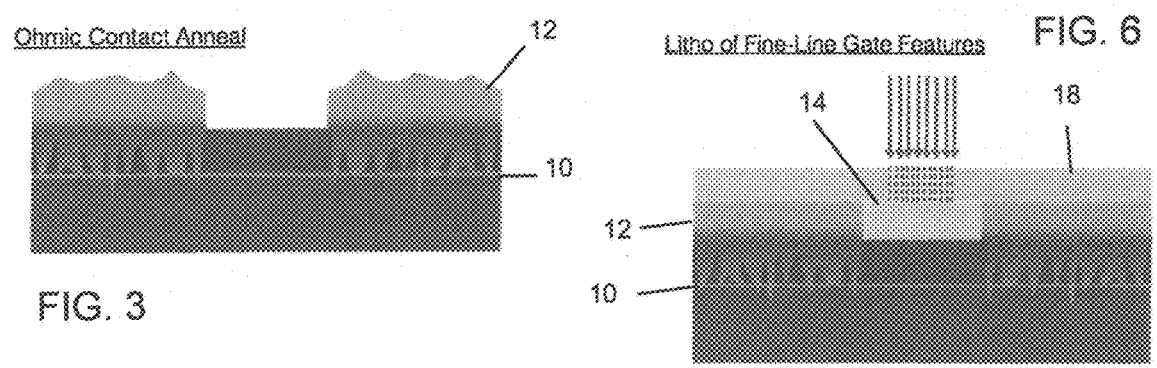
FIG. 3
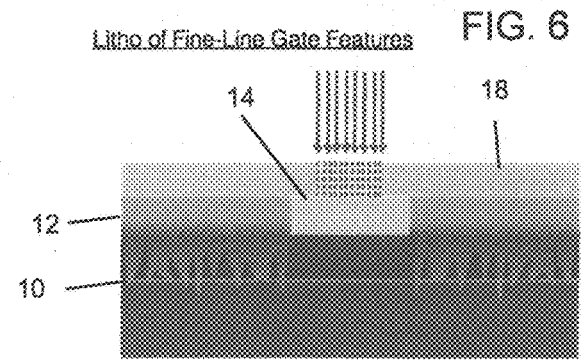
FIG. 7
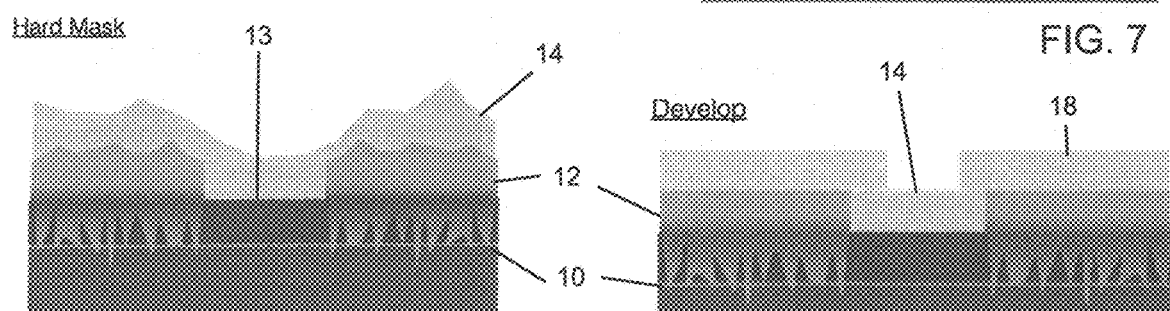
FIG. 4
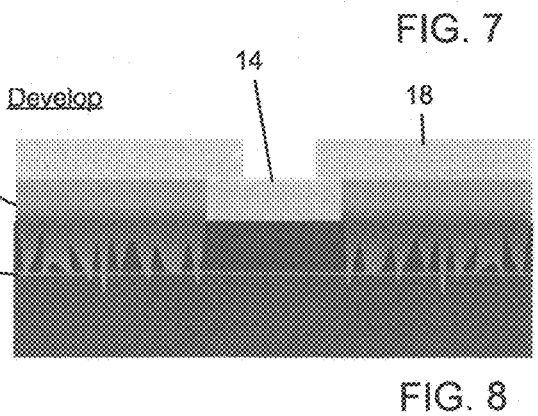
FIG. 8

PLANARIZATION AND FLIP-CHIP FABRICATION PROCESS OF FINE-LINE-GEOMETRY FEATURES WITH HIGH-ROUGHNESS METAL-ALLOYED SURFACES

RELATED APPLICATIONS

This patent application is related to U.S. Provisional Application No. 62/744,433 filed Oct. 11, 2018, entitled "Planarization and Flip-Chip Fabrication Process of Fine-Line-Geometry Features with High-Roughness Metal-Alloyed Surfaces" in the names of James Pao, Majid Riaziat, TaChung Wu, and Yi-Ching Pao, and which is incorporated herein by reference in its entirety. The present patent application claims the benefit under 35 U.S.C § 119(e).

TECHNICAL FIELD

The present application relates generally to the technical field of a semiconductor device fabrication, and more specifically, to a semiconductor device fabrication process that reduces the roughness of metal-alloy surfaces.

BACKGROUND

As semiconductor technologies have progressed in recent years, the industry's aggressive device feature size scaling has begun to encounter fundamental challenges due to physical limitations and characteristics. With the aim to scale down devices in order to meet demanding cost and performance goals, semiconductor devices have long ago crossed the sub-micron range, with cutting-edge devices even reaching nanometer-range limits. As technology nodes aggressively shrink, the paradigms governing both the semiconductor device physics and the semiconductor device fabrication must begin to transition to ensure both semiconductor device functionality and high yield.

An example of the fabrication challenges discussed above is the lithography needed to fabricate small semiconductor devices. Lithography for small features (sub-micron) is extremely challenging, if not impossible, for current standard photolithography systems due to the problem inherently rooted in the systems' optics, which is that the wavelengths used to define these semiconductor devices now happen to be larger than the desired minimum feature sizes. In response, there has been much interest in the continued development of shorter-wavelength photolithography systems, such as extreme-ultraviolet lithography, as a technology to surmount this obstacle. Photolithographic alternatives such as contact lithography and electron-beam lithography are also used to define extremely fine features in the semiconductor devices that need it.

For all lithography methods however, when dealing with feature sizes at the sub-micron range to even the sub-quarter micron range, results of the upstream processes will have a significant impact on the feasibility of defining and fabricating fine-line geometries. Specifically, if any adjacent metal-layer surfaces formed during fabrication are rough, this can lead to the resist used for the subsequent lithography having very rough surface morphology at the edge of the adjacent metal layer as well. Roughness of the resist may then lead to extremely poor fabrication results and consistency, as electron or photo exposure doses may very likely be uneven due to uneven resist thicknesses, which can lead to important areas being over- or underexposed. Roughness can also be hugely detrimental for stepper, contact, or electron beam lithography, resulting in defects that quickly propagate and spread over in large peripheral semiconductor device areas. The fabricated devices may function sub-optimally, or may even fail to function at all if the lithography step has caused breakage of patterns.

This surface roughness of adjacent metal layers can stem from different sources, and affect different layers of the semiconductor device stack. One example is the roughness of some alloyed ohmic contacts, which may be formed relatively early in the fabrication process, and which provides difficulty for downstream processes. This can be a very common fabrication problem for transistors as they become smaller and smaller. For example, Gallium nitride (GaN) High Electron Mobility. Transistors (HEMTs) (hereinafter GaN HEMTs)'s can be easily crippled during the ohmic contact fabrication phase, causing wafer yields to be low. GaN HEMTs have great promise to serve as high performance power devices, such as being used as power amplifiers for wireless communication and radar systems, as well as in power conversion electronics. Their appropriateness is attributable to several key performance benefits, including short channels coupled with high electron mobilities. Short gate lengths in the sub-quarter micron range or less are thus required, which are difficult to define using lithography if the ohmic contacts are mechanically and macroscopically rough.

Ohmic contacts for GaN HEMTs and other devices are usually a stack of metal layers deposited using e-beam evaporation or sputtering. The stack may then be annealed/sintered at high temperatures (700~800° C.) to allow for the metals to alloy and to force the metal layers to "sink-in" and permeate into the underlying epitaxial layers, in order for the electrical contacts to behave an ohmic manner. The difficulty in the contact fabrication arises generally because of this high temperature annealing process which forces different metal components within the contact metal layers to segregate. Specifically, it is challenging to achieve a low resistance contact that maintains good surface morphology. Annealing and/or sintering of the metal stack leads to very rough and bumpy contact surfaces, particularly in the presence of certain metals such as aluminum, which can prove to be an obstacle to the Schottky gate formation and further metal depositions. This is especially true when considering short gate-Length HEMTs, such as those in the sub-micron to sub-quarter-micron gate range. In addition to the rough morphology that results from the annealing, there can be significant lateral overflow of the contacts, which can short the gate to the source and/or drain or cause the gate metal to break into pieces of isolated segments over the entire gate width.

There have been multiple studies that have sought to explain this metal contact fabrication problem, seeking to provide solutions to reduce contact resistance, improve morphology and reduce its surface roughness, as well as attempts to do bot. One proposed explanation to the morphology problem is that annealing temperatures are done above the melting point of Al (660° C.) at temperatures that must be high enough to alloy to the channel. This alloying results in diffusion through the metal stack and causes metal segregation, resulting in a bumpy morphology.

A solution meant to address the above issue has been to use a contact recess etch to etch down through the AlGaN layer directly to the channel, which allows for the anneal to be done at a lower temperature which would then not affect the Al phase as was previously mentioned. This method involves extra fabrication steps, an extra lithography mask, and is heavily reliant on adequate cleaning of etch residue during the contact recess steps. Other solutions have proposed the addition of more interlayers in the metal stack which act as diffusion barriers, and seek to find metal ratios that optimize the resistance-morphology tradeoff. Most such approaches, including the two mentioned above, require more fabrication steps and additional materials, are limited in their applicable scope and still do not provide direct control over the metal surface morphology.

Therefore, it would be desirable to provide a device and method that overcomes the above. The device and method would solve the surface roughness challenge to allow for consistent fine-feature definition in the following lithographic steps, for any surface including those of rough adjacent metal contacts.

SUMMARY

In accordance with one embodiment, a method of semiconductor device fabrication that enables fine-line geometry lithographic definition and small form-factor packaging is disclosed. The method comprises: forming contacts on a metal layer of the semiconductor device; applying a protective mask layer over active regions and surfaces of the contacts having rough surface morphology; planarizing a surface of the semiconductor device until the protective mask layer is removed and the surfaces of the contacts having rough surface morphology are planarized; and forming contact stacks on the surfaces of the contacts which are planarized In accordance with one embodiment, a method of semiconductor device fabrication that enables fine-line geometry lithographic definition and small form-factor packaging is disclosed. The method comprises: forming contacts on a metal layer of the semiconductor device; applying a protective mask layer over active regions and surfaces of the contacts having rough surface morphology, wherein the protective mask has a thickness in a range of 0.05 to 0.2 micron range; planarizing a surface of the semiconductor device until the protective mask layer is removed and the surfaces of the contacts having rough surface morphology are planarized; applying a resist layer over the surface of the semiconductor device where the protective mask layer is removed and the surfaces of the contacts having rough surface morphology are planarized; lithography of fine line gate features on the resist layer; and forming contact stacks on the surfaces of the contacts which are planarized.

In accordance with one embodiment, a method of semiconductor device fabrication that enables fine-line geometry lithographic definition and small form-factor packaging is disclosed. The method comprises: forming contacts on a metal layer of the semiconductor device; applying a protective mask layer over active regions and surfaces of the contacts having rough surface morphology, wherein the protective mask has a thickness in a range of 0.05 to 0.2 micron range, wherein the thickness of the protective mask layer is approximately 50% of a thickness of the contacts; planarizing a surface of the semiconductor device until the protective mask layer is removed and the surfaces of the contacts having rough surface morphology are planarized; applying a resist layer over the surface of the semiconductor device where the protective mask layer is removed and the surfaces of the contacts having rough surface morphology are planarized; lithography of fine line gate features on the resist layer; forming solder bump bases on the surfaces of the contacts which are planarized; and forming a solder bump on each of each of the solder bump bases.

BRIEF DESCRIPTION OF THE DRAWINGS

The present application is further detailed with respect to the following drawings. These figures are not intended to limit the scope of the present application but rather illustrate certain attributes thereof. The same reference numbers will be used throughout the drawings to refer to the same or like parts.

FIGS. 1-18 are side views depicting exemplary embodiments of a method of semiconductor device fabrication that enables fine-line geometry lithographic definition and small form-factor packaging, in accordance with an aspect of the present application.

DESCRIPTION OF THE APPLICATION

Figure 9:
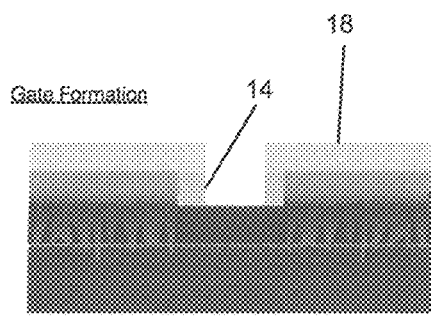

The description set forth below in connection with the appended drawings is intended as a description of presently preferred embodiments of the disclosure and is not intended to represent the only forms in which the present disclosure can be constructed and/or utilized. The description sets forth the functions and the sequence of steps for constructing and operating the disclosure in connection with the illustrated embodiments. It is to be understood, however, that the same or equivalent functions and sequences can be accomplished by different embodiments that are also intended to be encompassed within the spirit and scope of this disclosure.

The present disclosure provides a fabrication process that solves the surface roughness challenge to allow for consistent fine-feature definition in the following lithographic steps, for any surface including those of rough adjacent metal contacts. The fabrication process allows for a planar or an integrated flip-chip component utilizing solder bumps, built atop the planarized metal layers that allows for the described devices to maintain their desired small form-factors and feature sizes.

The fabrication process comprises several key processing steps, with the intention of enabling the consistent and predictable fabrication, especially lithographically, of semiconductor devices with very small minimum feature sizes. The steps, shown in the accompanying FIGs, involve depositing a hard mask (e.g. Si-based dielectric, polymeric resist, etc.), polishing the wafer (using chemical-mechanical polishing or physical grinding), then forming either additional top overlay metal to reduce the contact metal resistance, or use solder bumps to allow for flip-chip integration to an external circuit after the gate feature is formed.

Referring to the FIGs. a method of forming a semiconductor device having smooth surface morphology for consistent fine-line geometry may be disclosed. The present embodiment may be discussed as it relates to a GaN HEMT. However, the method may be applied to other types of semiconductor devices. Referring to FIG. 1, the process flow could begin with an epitaxial growth of an n-doped AlGaN barrier layer atop a GaN channel layer which has been grown on SiC. The formation of this heterojunction may create a 2-dimensional electron gas channel 10 in the GaN layer, near the hetero-interface. The channel 10 may be formed because the donor electrons in the AlGaN layer move to the newly-available lower energy states of the adjacent GaN layer. A balancing of this electron diffusion and the consequential build-up of a counteracting electric-field may occur until equilibrium may be achieved, and the electrons are confined in a narrow valley of a quantum well.

As may be seen in FIG. 2, metal contacts 12 (hereinafter contacts 12) may be formed on the AlGaN layer. The contacts 12 may be formed by depositing metal layers on the AlGaN layer. In FIG. 2, contacts for the ohmic contacts 12 of the drain and source for the HEMT may be formed. In accordance with one embodiment, the contacts 12 may be formed through depositing of the metal layers with e-beam evaporation or sputtering. A gap/channel may be formed between the contacts 12 formed.

Referring to FIG. 3, to ensure that the contacts 12 are made to the conducting 2D electron channel ohmic in nature, the wafer upon which the device is formed may be annealed at high temperatures (700~800° C.) to allow the metal stack forming the channels 12 to alloy and to reach, through the AlGaN barrier layer, the 2-dimensional electron gas channel 10 that was formed in the GaN layer. This annealing process may lower the contact 12 resistance, but also substantially roughens the surface morphology of the contact 12. This may make the next lithography step for gate definition, which is only a sub-micron away from the rough metal surface, extremely difficult if a conventional fabrication method is taken.

Since the surface of the contacts 12 are now very rough, the surface morphology of the resist will also be extremely rough. The resist roughness, coupled with the fact that the gates for these devices are extremely short and close to the adjacent metal edge, makes the following lithographic step hugely challenging. It is very probable that the exposure of the resist will be uneven and inadequate depending on the resist roughness. This will lead to devices that function poorly or not at all as the gate feature may be broken, or cannot even be fabricated completely. An alternative process flow could attempt to bypass this issue by first fabricating the gate before the ohmic contacts; this however is still problematic since the ohmic contacts 12 must still undergo annealing which will also affect the gate metal contact to the underlying semiconductors, possibly leading to a leaky gate when high gate biasing voltage is applied.

Referring to FIG. 4, the present method proceeds from the aforementioned epitaxial, metal contact deposition, and annealing steps to a deposition of a hard mask layer 14. The hard mask layer 14 may be applied over active regions 13 (surface area between contacts 12) and the surrounding areas having rough surface morphology (surface area of the contacts 12). The hard mask layer 14 may be formed of dielectrics such as $SiO_x$, $SiN_x$ or polymers. The hard mask layer 14 may be deposited using chemical vapor deposition (CVD) or can be spun on such as Polyimide. Polymeric resists can also be used, which would allow a dielectric layer to be skipped. The hard mask layer 14 may serve to protect the active region 13 of the device during the next process step.

In accordance with one embodiment, the mask layer 14 may be applied in a thickness range of approximately 0.05 to 0.2 microns. The thickness of the mask layer 14 should be chosen to be roughly about 50% of the contact 12 thickness.

Referring to FIG. 5, after deposition of the hard mask layer 14, the entire wafer upon which the device is formed upon is flipped over and planarized. This may be done with chemical-mechanical polishing (CMP), which may use a rotating mechanical apparatus in conjunction with a slurry composed of abrasive particles and a chemical corrosive. The chemical and physical characteristics of the slurry may be chosen for appropriateness with the surfaces to be polished (such as the hard mask layer 14, the contact 12, etc.). The slurry may be a chemical and physical slurry that contains elements or compounds that chemically remove the mask materials, and an abrasive (e.g. particulates) that physically removes the chosen mask materials or chemical and physical slurry that contains elements or compounds that chemically remove the chosen alloyed metal materials, and an abrasive (e.g. particulates) that physically removes the chosen alloyed metal materials, The compound for CMP should have a grain size of less than one tenth of the metal thickness which is to be removed and polished in order to ensure a smooth surface after the planarization process.

A simpler grinding process (e.g. sanding down the hard mask and rough surface using sandpaper) can also be used if the surface roughness is extremely high and the desired final state does not need to be extremely smooth. This polishing or grinding process may be done until the hard mask layer 14 over the target surface is completely removed, and continued until the target surface (contact 12) has been planarized and smoothened. The hard mask layer 14 may protect the active region during this chemical-physical or physical planarization process.

Referring to FIGS. 6-10 once surface smoothness has been achieved, a resist layer 18 may be applied. The morphology of the resist layer 18 applied after the planarization step may also be smooth. The smooth resist 18 may be over the same level, of the polished metal surface which allow for the lithography of fine line gate features, which may be one of many types, to proceed with much greater feature and pattern control and predictability. Specifically, exposure may be confined and even, and the resist 18 development should yield clean geometries that may allow for consistent and thorough subsequent fabrication steps. Using the example of the GaN HEMT, smooth resist 18 morphology can allow for e-beam lithographic definition of sub-micron down to a tenth or even sub tenth-of-a-micron sized gates. A solvent, called a developer, may then be applied to the surface of the resist 18. The gate terminal 20 may then be formed in an area exposed by the developer.

Figure 11:
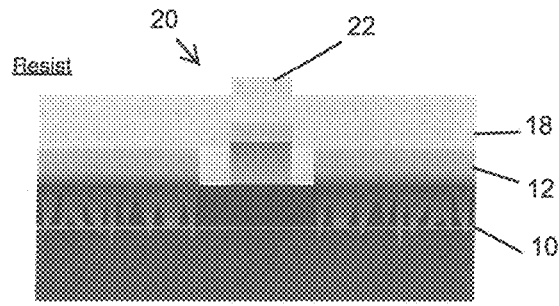
Figure 12:
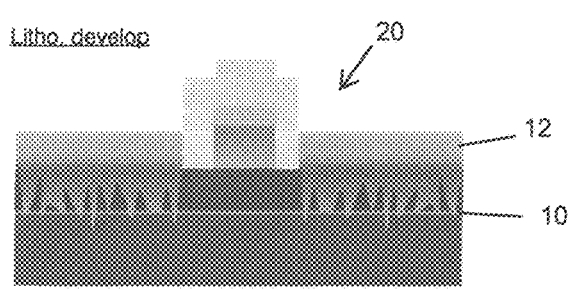
Figure 16:
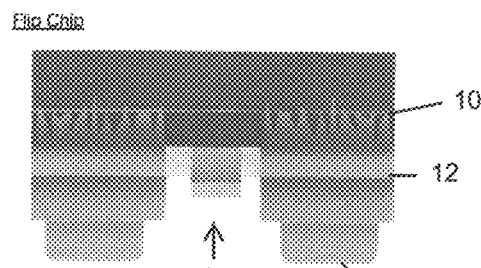

Referring to FIG. 11, after formation of the gate terminal 20, the gate terminal 20 may be protected by a resist layer 22. This may allow a solder bump component of the fabrication process to occur, if chosen. Then, through lithography and application of a developer, the contacts 12 may be exposed as shown in FIG. 12.

Figure 13:
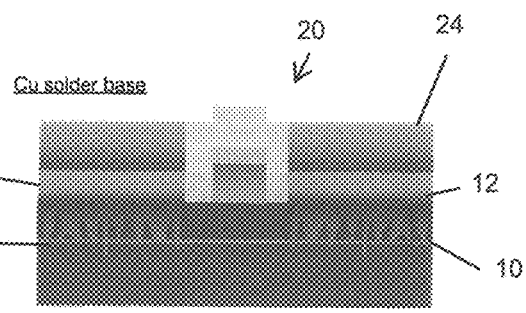
Figure 10:
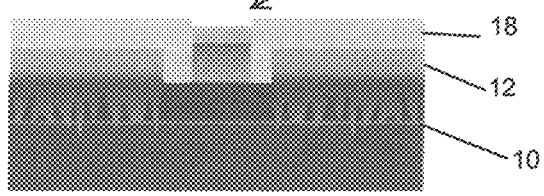

Referring to FIG. 13, solder bump bases 24 may be plated onto the smoothened and flattened contacts 12. In the present embodiment, the solder bump bases 24 may be formed by applying different metal layers on top of one another. In accordance with one embodiment, a metal stack of Ti, Al, and Cu may be applied to form the solder bump bases 24.

Figure 14:
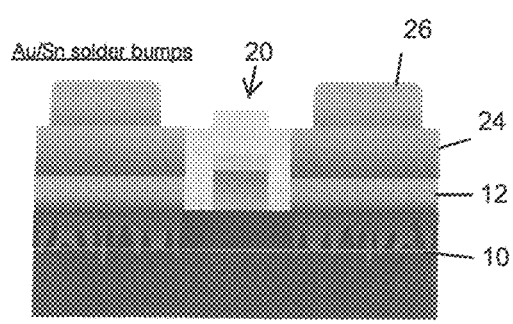

Referring to FIG. 14, solder bumps 26 may then be formed on the solder bump base 24. A suitable solder bump material may be applied atop the solder bump base 24 to form the solder bumps 26. In accordance with one embodiment, the solder bumps 26 may be formed by applying Au/Sn atop the Ti/Al/C metal stacks to form the solder bumps 26.

Figure 15:
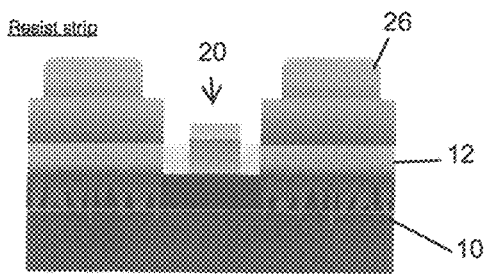
Figure 17:
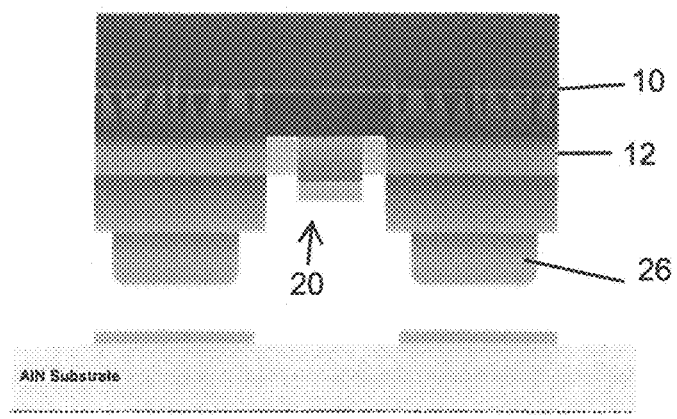
Figure 18:
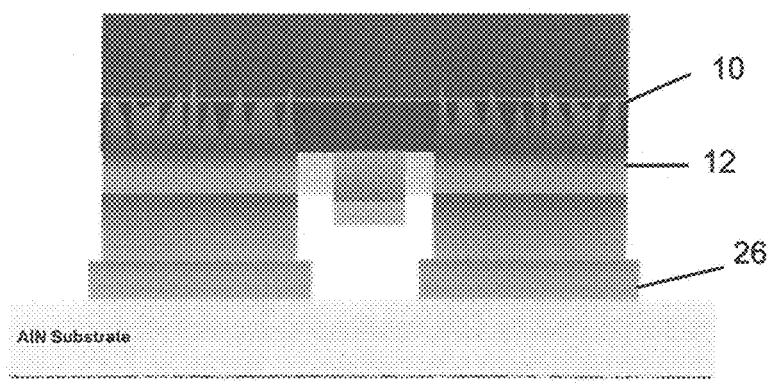

Referring to FIG. 15, a lift-off of the resist layer 22 may then performed to reveal the finished devices. The final devices are separated according to the appropriate application into individual chips. These chips can then be flip-chip integrated into external circuits as shown in FIG. 17. Reflowing (~200 to 300° C.) the Au/Sn solder bumps as shown in FIG. 18 provides a simple solution to connect the devices to the external circuit. It is important to note that this solder bump solution can only be formed if the contact metal surfaces have been planarized and smoothened in a manner such as the one described herein this invention.

What has been described is a full sequence of fabrication processes that enables lithographic definition of fine-line geometries where surfaces surrounding the target area may be rough, as well as provides a flip-chip integration solution, using several key steps including a hard mask deposition, a polishing/grinding step, and flip-chip solder bump formation. This process can be targeted towards any semiconductor device with rough metal-alloyed surfaces—inclusive of but not limited to metal contact surfaces—to allow for successful further processing of extremely small features. The process allows for any polishing/grinding method that can include chemical, physical, or any other components for planarization. Lastly, this process includes the flip-chip intended solder bump formation that affords a multitude of performance and cost benefits, including enhanced RF performance due to signals not needing to travel through substrates, design flexibility due to small form-factor of flip-chip packages, reduction of via holes needed, faster and simpler assembly, and lower overall cost from higher device yields and trimming fabrication steps and materials.

The foregoing description is illustrative of particular embodiments of the application, but is not meant to be a limitation upon the practice thereof. The following claims, including all equivalents thereof, are intended to define the scope of the application.

What is claimed is:

1. A method of semiconductor device fabrication that enables fine-line geometry lithographic definition and small form-factor packaging comprising:
    forming contacts on a metal layer of the semiconductor device;
    applying a protective mask layer over active regions and surfaces of the contacts having rough surface morphology;
    planarizing a surface of the semiconductor device until the protective mask layer is removed and the surfaces of the contacts having rough surface morphology are planarized;
    applying a resist layer over the surface of the semiconductor device where the protective mask layer is removed and the surfaces of the contacts having rough surface morphology after planarizing;
    lithography of fine line gate features on the resist layer; and
    forming contact stacks on the surfaces of the contacts which are planarized.

2. The method of claim 1, wherein planarizing the protective mask layer comprises chemical-mechanical polishing (CMP) the protective mask layer until the protective mask layer is removed and the surfaces of the contacts which are planarized.

3. The method of claim 1, wherein planarizing the protective mask layer comprises grinding the protective mask layer until the protective mask layer is removed and the surfaces of the contacts which are planarized.

4. The method of claim 1, wherein applying a protective mask layer comprises applying the protective mask in a thickness of 0.05 to 0.2 micron range.

5. The method of claim 1, wherein applying a protective mask layer comprises applying the protective mask layer in a thickness of 0.05 to 0.2 micron range, the thickness of the protective mask layer being approximately 50% of a thickness of the contacts.

6. The method of claim 2, wherein planarizing the protective mask layer with chemical-mechanical polishing (CMP) comprises polishing with a chemical and physical slurry, the chemical and physical slurry comprises at least one of elements that chemically remove materials of the protective mask layer and an abrasive that physically removes the materials of the protective mask and elements that chemically remove materials of the contacts and an abrasive that physically removes the materials of the contacts.

7. The method of claim 6, wherein the chemical and physical slurry has abrasives having a granular size of less than one tenth of a metal thickness of the contacts.

8. The method of claim 1, comprising:
    applying a solvent to the resist layer to expose a surface area between the contacts; and
    forming the gate terminal in the surface area exposed between the contacts.

9. The method of claim 1, comprising forming a solder bump on each of the contact stacks.

10. A method of semiconductor device fabrication that enables fine-line geometry lithographic definition and small form-factor packaging comprising:
    forming contacts on a metal layer of the semiconductor device;
    applying a protective mask layer over active regions and surfaces of the contacts having rough surface morphology, wherein the protective mask has a thickness in a range of 0.05 to 0.2 micron range;
    planarizing a surface of the semiconductor device until the protective mask layer is removed and the surfaces of the contacts having rough surface morphology are planarized;
    applying a resist layer over the surface of the semiconductor device where the protective mask layer is removed and the surfaces of the contacts having rough surface morphology are planarized;
    lithography of fine line gate features on the resist layer in a surface area between the contacts after planarizing the surface of the semiconductor device;
    forming the gate terminal in the surface area exposed between the contacts after planarizing the surface of the semiconductor device; and
    forming contact stacks on the surfaces of the contacts which are planarized.

11. The method of claim 10, wherein planarizing the protective mask layer comprises chemical-mechanical polishing (CMP) the protective mask layer until the protective mask layer is removed and the surfaces of the contacts which are planarized.

12. The method of claim 10, wherein planarizing the protective mask layer comprises grinding the protective mask layer until the protective mask layer is removed and the surfaces of the contacts which are planarized.

13. The method of claim 10, wherein the thickness of the protective mask layer is approximately 50% of a thickness of the contacts.

14. The method of claim 11, wherein planarizing the protective mask layer with chemical-mechanical polishing (CMP) comprises polishing with a chemical and physical slurry, the chemical and physical slurry comprises at least one of elements that chemically remove materials of the protective mask layer and an abrasive that physically removes the materials of the protective mask and elements that chemically remove materials of the contacts and an abrasive that physically removes the materials of the contacts.

15. The method of claim 14, wherein the chemical and physical slurry has abrasives having a granular size of less than one tenth of a metal thickness of the contacts.

16. The method of claim 10, comprising forming a solder bump on each of the contact stacks.

17. A method of semiconductor device fabrication that enables fine-line geometry lithographic definition and small form-factor packaging comprising:
- forming contacts on a metal layer of the semiconductor device;
- applying a protective mask layer over active regions and surfaces of the contacts having rough surface morphology, wherein the protective mask has a thickness in a range of 0.05 to 0.2 micron range, wherein the thickness of the protective mask layer is approximately 50% of a thickness of the contacts;
- planarizing a surface of the semiconductor device until the protective mask layer is removed and the surfaces of the contacts having rough surface morphology are planarized;
- applying a resist layer over the surface of the semiconductor device where the protective mask layer is removed and the surfaces of the contacts having rough surface morphology are planarized;
- lithography of fine line gate features on the resist layer in a surface area between the contacts after planarizing the surface of the semiconductor device;
- forming the gate terminal in the surface area exposed between the contacts after planarizing the surface of the semiconductor device;
- forming solder bump bases on the surfaces of the contacts which are planarized; and
- forming a solder bump on each of each of the solder bump bases.

18. The method of claim 17, wherein planarizing the protective mask layer comprises chemical-mechanical polishing (CMP) the protective mask layer until the protective mask layer is removed and the surfaces of the contacts which are planarized, wherein planarizing the protective mask layer with chemical-mechanical polishing (CMP) comprises polishing with a chemical and physical slurry, the chemical and physical slurry comprises at least one of elements that chemically remove materials of the protective mask layer and an abrasive that physically removes the materials of the protective mask and elements that chemically remove materials of the contacts and an abrasive that physically removes the materials of the contacts.

19. The method of claim 18, wherein the chemical and physical slurry has abrasives having a granular size of less than one tenth of a metal thickness of the contacts.

20. The method of claim 17, wherein planarizing the protective mask layer comprises grinding the protective mask layer until the protective mask layer is removed and the surfaces of the contacts which are planarized.

* * * * *